United States Patent [19]
Werner et al.

[11] Patent Number: 6,127,243
[45] Date of Patent: Oct. 3, 2000

[54] METHOD FOR BONDING TWO WAFERS

[75] Inventors: Wolfgang Werner, München; Jenoe Tihanyi, Kircheim; Oliver Hassa, München, all of Germany

[73] Assignee: Siemens Aktiengesellschaft, Munich, Germany

[21] Appl. No.: 09/267,293

[22] Filed: Mar. 12, 1999

[30]     Foreign Application Priority Data

Mar. 12, 1998 [DE]    Germany ............................ 198 10 828

[51] Int. Cl.⁷ ................................................. H01L 21/762
[52] U.S. Cl. ........................... 438/456; 438/406; 438/459
[58] Field of Search .................................... 438/406, 456, 438/459, FOR 222, 931, 964, 977; 148/DIG. 12

[56]           References Cited

U.S. PATENT DOCUMENTS

| | | |
|---|---|---|
| 3,902,936 | 9/1975 | Price . |
| 4,883,215 | 11/1989 | Goesele et al. . |
| 5,238,865 | 8/1993 | Eguchi . |
| 5,573,972 | 11/1996 | Kobayashi . |
| 5,807,783 | 9/1998 | Gaul et al. . |
| 5,877,070 | 3/1999 | Goesele et al. . |
| 5,937,312 | 10/1999 | Iyer et al. . |

OTHER PUBLICATIONS

Kissinger, W., et al., "Microstructures for Perfect Wafer Bonding in Different Temperature Ranges", Extended Abstracts of the Electrochemical Society, Fall Meeting, p. 681, Oct. 1991.

"Silicon Carbide Wafer Bonding", Q.-Y. Tong et al., J. Electrochem.Soc., vol. 142, No. 1, Jan. 1995, pp. 232–236.

*Primary Examiner*—George Fourson
*Attorney, Agent, or Firm*—Herbert L. Lerner; Laurence A. Greenberg; Werner H. Stemer

[57]           ABSTRACT

The invention relates to a method for bonding two wafers, in which the wafers are placed over one another in such a way that a first surface of one wafer lies over a first surface of the other wafer. Trenches are introduced into at least one of the first surfaces. The trenches run in the plane of the surfaces. The wafers lying one on top of the other are then subjected to a heat treatment in an oxidizing atmosphere.

13 Claims, 1 Drawing Sheet

METHOD FOR BONDING TWO WAFERS

BACKGROUND OF THE INVENTION

Field of the Invention

The present invention relates to the semiconductor field, and more specifically, to a method for bonding two wafers.

In integrated circuits traditional dielectric insulation has been used for decades whenever direct electrical isolation between individual components is indispensable. Such direct electrical insulation can extend to an integrated circuit or a component being dielectrically totally insulated from another integrated circuit or another component. This means that the respective integrated circuits or components in a substrate are totally isolated from neighboring integrated circuits or components by means of dielectric insulation. Consequently, such total dielectric insulation necessitates horizontal dielectric insulation on the side toward the substrate, the side being opposite to the surface of the integrated circuit, and vertical dielectric insulation, which leads from the horizontal dielectric insulation to the surface of the substrate and surrounds the integrated circuit or the component.

Integrated circuits or components which are dielectrically insulated in this way are used, by way of example, in switching technology, in military applications which demand high radiation resistance, and increasingly in power electronics as well.

Specifically in order to produce the horizontal insulation, a so-called handle wafer and a wafer are bonded directly to one another, one or both wafers are provided with an oxidation layer on the surfaces to be bonded. This procedure is referred to as the "DWB method" (Direct Wafer Bonding) and has been used for a long time: the two wafers, which are as smooth as possible and are oxidized on one or both sides, are placed on top of one another and subjected to a heat treatment at 1000 to 1400° C., preferably 1200° C. Atomic bonds of greater or lesser strength are evidently formed between the two wafers in the course of this heat treatment.

The wafer into which the integrated circuits or components are to be introduced is then thinned by grinding. Vertical insulation is applied by first etching trenches in from the surface of the thinned wafer, and these trenches reach as far as the oxide layer at the boundary between the two wafers bonded to one another. These trenches are finally filled with silicon dioxide or polycrystalline silicon.

In this way, it is possible to produce individual monocrystalline silicon islands in the thus "active" wafer, which islands are totally dielectrically insulated from one another.

The production of such DWB wafers from two wafers bonded to one another with a diameter of 6" is very complicated and gives rise to costs which are approximately an order of magnitude higher than the costs of an individual standard wafer. The cause of this high outlay is found in the low yield during the production of the DWB wafers: the adhesion between the wafers bonded one on top of the other is difficult to control, flexure of the individual wafers occurs, and detachment of individual silicon islands in the active wafer from the handle wafer may be observed.

In order to overcome these difficulties, special attention has been directed heretofore at configuring the bonding surfaces of the two wafers to be as smooth as possible. Although considerable progress has been achieved in that area, a decisive breakthrough has been unattainable to date. The problems evinced above have not been able to be solved to date.

SUMMARY OF THE INVENTION

It is accordingly an object of the present invention to provide a method for bonding two wafers in which a coherent, insulating layer is fabricated between the wafers. The layer having minimum flexure, ensuring reliable bonding between the wafers, and requiring little outlay in terms of production.

With the foregoing and other objects in view there is provided, in accordance with the invention, a method for bonding two wafers, which comprises:

providing a first wafer having a surface;

providing a second wafer having a surface;

forming trenches in the surface of at least one of the first wafer and the second wafer, the trenches running in a plane of the surface;

placing the surface of the first wafer over the surface of the second wafer; and heat-treating the first wafer and the second wafer in an oxidizing atmosphere.

In accordance with an added feature of the invention, the step of heat-treating is performed in an oxygen-containing atmosphere at a temperature of 800 to 900° C.

In accordance with an additional feature of the invention, the step of heat-treating is performed in a nitrogen-containing atmosphere.

In accordance with another feature of the invention, the step of heat-treating is performed at a temperature of 800 to 900° C.

In accordance with a further added feature of the invention, the step of forming trenches comprises etching the trenches to a depth of substantially 1 $\mu$m.

In accordance with a further additional feature of the invention, the step of forming trenches comprises spacing the trenches from 2 to 10 $\mu$m between one another.

In accordance with again an added feature of the invention, the step of forming trenches comprises wet-chemically etching the trenches.

In accordance with again an additional feature of the invention, the step of forming trenches comprises forming the trenches to run in more than one direction.

In accordance with again another feature of the invention, the step of providing the first wafer comprises providing a handle wafer as the first wafer and wherein the step of forming the trenches is performed by forming the trenches in the handle wafer.

In accordance with an added further feature of the invention, the step of forming the trenches comprises forming the trenches with a V-shaped cross section.

In accordance with an additional further feature of the invention, at least one of the first wafer and the second wafer is provided as a silicon wafer.

In accordance with another further feature of the invention, one of the first wafer and the second wafer is provided as a silicon wafer, and the other of the first wafer and the second wafer is provided as a silicon carbide wafer.

In accordance with a concomitant feature of the invention, at least one of the first wafer and the second wafer is provided as a silicon carbide wafer.

In a complete departure from the prior art, the invention takes a different route. Instead of providing the smoothest possible surfaces on the wafers to be bonded, one of the surfaces of the wafers to be bonded is deliberately provided with trenches running in both directions of the surface. The trenches may have a depth of about 1 $\mu$m and are arranged with a spacing of about 2 to 10 $\mu$m between one another. A surface of a wafer patterned in such a way, for instance that of the handle wafer, then has the other wafer applied to it.

The other wafer, as previously provided, has a smooth surface, and if appropriate, can be provided with an oxide layer. The two wafers lying one on top of the other are exposed to an oxygen-containing atmosphere, for example water vapor, at temperatures of between 800° and 900° C. In the process, the oxygen diffuses through the trenches, and $SiO_2$ is thereby formed between the two wafers, which leads to a strong bond between the wafers. However, it is also possible, by way of example, to expose Si wafers to a nitrogen-containing atmosphere, with the result that $Si_3N_4$ is formed as the dielectric. Other dielectrics in addition to $SiO_2$ and $Si_3N_4$ are also possible.

At the specified temperature of between 800 and 900° C., which is considerably below the temperature of about 1200° C. customary heretofore, oxygen can spread uniformly in the capillary-like, fine channels because of the high diffusion coefficient. Furthermore, at the temperatures specified, the oxidation rate is so low that approximately the same oxygen partial pressure prevails at every point in the trenches, thereby ensuring uniform and thus also reliable bonding of the two wafers to one another.

The trenches are not exclusively filled, therefore, rather they are oxidized to a certain extent in the bonded state. A coherent, thin, high temperature-resistant adhesive bond between the two wafers to be bonded is fabricated in this way, and the adhesive bond is composed of silicon dioxide grown thermally.

The introduction of the trenches into one of the two wafers, that is to say either the handle wafer or the active wafer, can be done, by way of example, wet-chemically by etching using KOH.

What is essential in the method according to the invention is the feeding in of oxygen. This oxygen penetrates through the trenches by means of diffusion into the regions between the two wafers. An oxide layer which bonds the two wafers is thereby formed between the wafers.

The method according to the invention is especially suitable for bonding silicon wafers. However, it can be used in entirely general terms for wafers composed of an oxidizable material. Thus, by way of example, it can also advantageously be used for SiC wafers.

It is particularly advantageous if the method according to the invention is used for bonding SiC wafers on silicon wafers. Because there are typically no suitable processing machines for SiC wafers having a wafer diameter of about 3–4 cm, it would be very advantageous to fix the SiC wafers on, for example, 6" wafers using the method according to the invention. In this way, it would then be possible to fix about 5–8 SiC wafers on an individual 6" silicon wafer. It would then be possible, in a simple manner, to utilize the process machines used in a 6" silicon wafer line. For example, ion implantation, diffusion and/or lithography could be accomplished with SiC wafers using the standard machines available in the 6" silicon wafer line. Such a procedure has enormous cost advantages for the production of SiC components.

The trenches in the surface of one of the two wafers preferably run perpendicularly to one another. However, such a perpendicular course of the trenches is in no way absolutely necessary. Rather, it is also possible to allow the trenches to run at an inclination with respect to one another. All that is of importance is that the trenches ensure that the oxygen can pass by diffusion into practically all regions at the interface between the two wafers.

The oxygen atmosphere need not just involve an atmosphere of pure oxygen ($O_2$) or a water vapor atmosphere. Rather, it is possible to use, for this atmosphere, oxygen compounds or generally any substances which can oxidize the two wafers.

Other features which are considered as characteristic for the invention are set forth in the appended claims.

Although the invention is illustrated and described herein as embodied in a method for bonding two wafers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
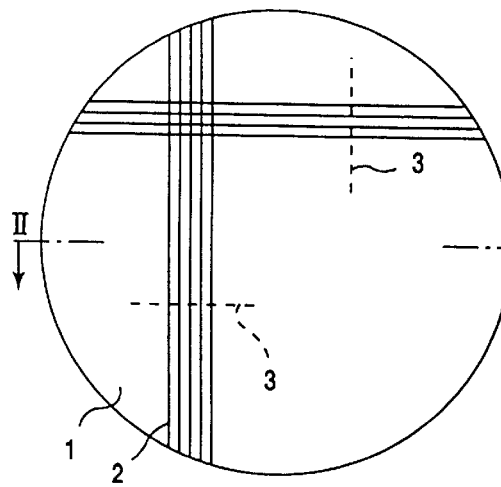
FIG. 1 shows a plan view of a handle wafer.

In FIGS. 1 to 6, the same reference symbols are used in each case for mutually corresponding structural parts. FIG. 1 shows a plan view of a handle wafer 1. Trenches 2, which each have a width and a depth of about 1 µm and are arranged with a spacing of between 2 and 10 µm between one another, are introduced into the surface of the handle wafer 1. These trenches 2 may have a V-shaped profile. It goes without saying, however, that other profiles are also possible, such as, by way of example, a U-shaped profile, a semicircular profile, a half-oval profile, a square profile or generally a rectangular profile. These trenches 2 extend over the entire surface of the wafer 1, and this is indicated by dashed lines 3.

Although the trenches 2 are shown in each case perpendicular to one another in FIG. 1, this perpendicular arrangement is not necessary. The trenches 2 can also run at an inclination with respect to one another or can even be arranged more or less "randomly." The important aspect is that when the surface of the wafer 1 is covered by a further wafer, the trenches 2 ensure that oxygen or another oxidizing agent can pass to practically all locations on the surface of the wafer 1.

Figure 2:
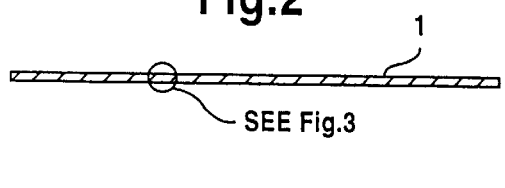
FIG. 2 shows a section II—II through the wafer of FIG. 1.
Figure 3:
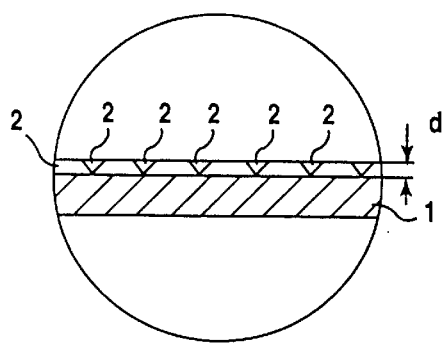
FIG. 3 shows a detail A of the wafer of FIGS. 1 and 2.

FIG. 2 shows a section II—II through the wafer of FIG. 1, and FIG. 3 shows a detail A of the wafer of FIGS. 1 and 2. FIG. 3 shows how the trenches 2 with a V-shaped cross section are arranged in the surface of the wafer 1. At the same time, the section is in this case taken through a "horizontally" routed trench 2, with the result that this trench 2 can be seen in addition to the profile of the perpendicular trenches 2. FIG. 3 also shows the penetration depth d of the trenches, which as has already been explained, is approximately 1 µm.

Trenches 2 are introduced into the wafer 1 in a customary manner by etching, for which purpose photoresist and etching technology is employed.

The surface of the wafer 1 into which the trenches 2 are introduced is preferably an oxidized surface of the wafer 1. In other words the trenches 2 extend in a thin silicon dioxide layer, if the wafer 1 itself is composed of mono- or polycrystalline silicon.

Figure 4:
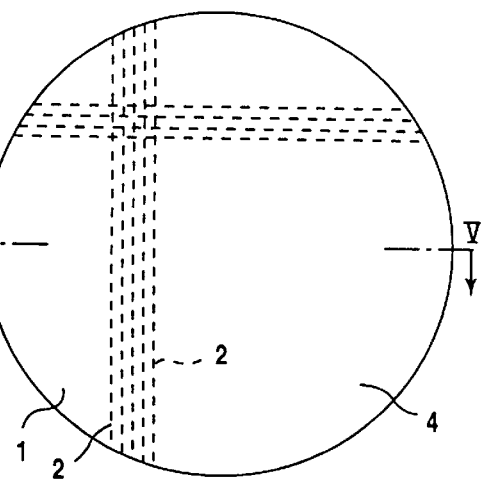
FIG. 4 shows a plan view of a DWB wafer having two wafers.
Figure 5:
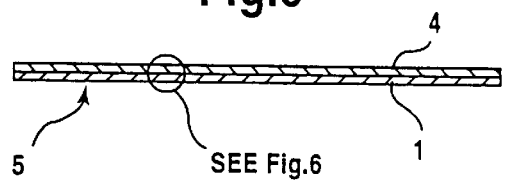
FIG. 5 shows a section V—V through the wafer of FIG. 4.

FIGS. 4 and 5 show a state in which an "active" wafer 4 is additionally placed onto the handle wafer 1. In this case, the trenches 2 of the wafer 1 are indicated using dashed lines in FIG. 4. The surface of the wafer 4 opposite the wafer 1 is smooth in this case. This surface of the wafer 4 may be oxidized, if appropriate. It is sufficient, however, if merely one of the surfaces of the two wafers 1 and 4 is provided with an oxidation layer.

The wafers 1, 4 are preferably composed of silicon or silicon carbide (SiC). It is also sufficient, however, if only one of these wafers is produced from silicon or silicon carbide. As has already been explained, it is particularly advantageous if at least one SiC wafer is bonded to a Si wafer.

In a preferred exemplary embodiment, the surface of the wafer 1 in which the trenches 2 are introduced is oxidized, while the smooth surface of the wafer 4 is not oxidized.

If appropriate, however, it is also possible to proceed in an opposite manner. The surface of the "active" wafer 4 can be provided with trenches 2, while the surface of the handle wafer 1 can be smooth. In this case as well, at least one of the two surfaces is oxidized, that is to say either the surface of the wafer 4 provided with trenches 2 or the surface of the smooth wafer 1. If appropriate, however, it is also possible for both surfaces to be oxidized.

What is critical for the arrangement of the trenches 2, is that the trenches 2 ensure that oxygen or another oxidizing agent can pass to all regions of the surfaces of the wafers 1, 4 to be bonded to one another.

Figure 6:
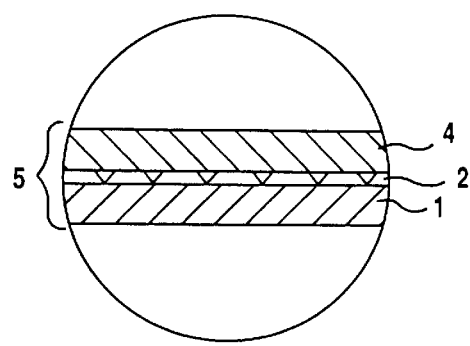
FIG. 6 shows a detail B of the wafer of FIGS. 4 and 5.

After the two wafers 1, 4 have been placed one on top of the other, as is evident especially from the detail B in FIG. 6, the wafers 1, 4, which form a wafer 5, are subjected to heat treatment in an oxygen-containing atmosphere at 800 to 900° C. In the process, the oxygen diffuses through the trenches 2 and leads to a strong bond between the two wafers 1, 4, thereby producing the wafer 5 in which the two wafers 1, 4 are reliably bonded to one another. It has been shown that practically no failures occur with a procedure of this type, with the result that the production costs for the wafer 5 can be considerably reduced.

We claim:

1. A method for bonding two wafers, which comprises:

providing a first wafer having a surface;

providing a second wafer having a surface;

forming trenches in the surface of at least one of the first wafer and the second wafer, the trenches running in a plane of the surface;

placing the surface of the first wafer over the surface of the second wafer; and heat-treating the first wafer and the second wafer in an oxidizing atmosphere at a temperature of 800 to 900° C.

2. The method according to claim 1, wherein the step of heat-treating is performed in an oxygen-containing atmosphere.

3. The method according to claim 1, wherein the step of heat-treating is performed in a nitrogen-containing atmosphere.

4. The method according to claim 3, wherein the step of heat-treating is performed at a temperature of 800 to 900° C.

5. The method according to claim 1, wherein the step of forming trenches comprises etching the trenches to a depth of substantially 1 $\mu$m.

6. The method according to claim 1, wherein the step of forming trenches comprises spacing the trenches from 2 to 10 $\mu$m between one another.

7. The method according to claim 1, wherein the step of forming trenches comprises wet-chemically etching the trenches.

8. The method according to claim 1, wherein the step of forming trenches comprises forming the trenches to run in more than one direction.

9. The method according to claim 1, wherein the step of providing the first wafer comprises providing a handle wafer as the first wafer and wherein the step of forming the trenches is performed by forming the trenches in the handle wafer.

10. The method according to claim 1, wherein the step of forming the trenches comprises forming the trenches with a V-shaped cross section.

11. The method according to claim 1, which comprises providing at least one of the first wafer and the second wafer as a silicon wafer.

12. The method according to claim 1, which comprises providing one of the first wafer and the second wafer as a silicon wafer, and providing the other of the first wafer and the second wafer as a silicon carbide wafer.

13. The method according to claim 1, which comprises providing at least one of the first wafer and the second wafer as a silicon carbide wafer.

* * * * *